US010606975B2

(12) United States Patent
Sha et al.

(10) Patent No.: US 10,606,975 B2
(45) Date of Patent: Mar. 31, 2020

(54) COORDINATES-BASED GENERATIVE ADVERSARIAL NETWORKS FOR GENERATING SYNTHETIC PHYSICAL DESIGN LAYOUT PATTERNS

(71) Applicant: International Business Machines Corporation, Armonk, NY (US)

(72) Inventors: Jing Sha, White Plains, NY (US); Michael A. Guillorn, Cold Springs, NY (US); Derren N. Dunn, Sandy Hook, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/994,598

(22) Filed: May 31, 2018

(65) Prior Publication Data
US 2019/0370431 A1 Dec. 5, 2019

(51) Int. Cl.
*G06F 17/50* (2006.01)
*G06N 3/04* (2006.01)

(52) U.S. Cl.
CPC ...... *G06F 17/5072* (2013.01); *G06F 17/5077* (2013.01); *G06N 3/04* (2013.01)

(58) Field of Classification Search
CPC .................................................. G06F 17/5072
USPC ....................................................... 716/119
See application file for complete search history.

(56) References Cited

U.S. PATENT DOCUMENTS 7,930,667 B2   4/2011   Bergman Reuter et al.
9,122,828 B2   9/2015   Chiang et al.
9,626,459 B2   4/2017   Agarwal et al.
(Continued)

OTHER PUBLICATIONS

I.J. Goodfellow et al., "Generative Adversarial Nets," Proceedings of the 27th International Conference on Neural Information Processing Systems (NIPS), Dec. 8-13, 2014, pp. 2672-2680, vol. 2.
(Continued)

*Primary Examiner* — Suchin Parihar
(74) *Attorney, Agent, or Firm* — Vazkan Alexanian; Ryan, Mason & Lewis, LLP

(57) ABSTRACT

A method for generating physical design layout patterns includes the step of selecting one or more physical design layouts, a given physical design layout comprising a set of physical design layout patterns for features in at least one layer of a given patterned structure. The method also includes the step of converting the physical design layout patterns into coordinate arrays, a given coordinate array comprising feature center coordinates for the features in a given one of the physical design layout patterns. The method further includes the step of training, utilizing the coordinate arrays, a generative adversarial network (GAN) comprising discriminator and generator neural networks. The method further includes the step of generating one or more synthetic coordinate arrays utilizing the trained generator neural network of the GAN, a given one of the synthetic coordinate arrays comprising feature center coordinates of features for a new physical design layout pattern.

20 Claims, 11 Drawing Sheets

(56) References Cited

U.S. PATENT DOCUMENTS

| | | | |
|---|---|---|---|
| 2015/0286766 A1 | 10/2015 | Singh et al. | |
| 2016/0180263 A1 | 6/2016 | Mourra | |
| 2016/0328644 A1 | 11/2016 | Lin et al. | |
| 2016/0378902 A1 | 12/2016 | Graur et al. | |
| 2017/0357911 A1* | 12/2017 | Liu | G06F 17/5068 |
| 2018/0275523 A1* | 9/2018 | Biafore | G01N 21/8806 |
| 2018/0285510 A1* | 10/2018 | Lutich | G03F 1/36 |
| 2018/0293205 A1* | 10/2018 | Koker | G06F 15/8007 |
| 2018/0300434 A1* | 10/2018 | Hu | G06F 17/504 |
| 2019/0138847 A1 | 5/2019 | Shor et al. | |
| 2019/0139641 A1 | 5/2019 | Itu et al. | |
| 2019/0147134 A1* | 5/2019 | Wang | G06F 17/5081 |
| 2019/0147320 A1 | 5/2019 | Mattyus et al. | |
| 2019/0188537 A1 | 6/2019 | Dutta et al. | |
| 2019/0204755 A1* | 7/2019 | Kicken | G03F 7/70283 |
| 2019/0220652 A1 | 7/2019 | Li et al. | |
| 2019/0228051 A1* | 7/2019 | Langhammer | G06F 17/16 |
| 2019/0266479 A1* | 8/2019 | Singh | G06F 17/175 |
| 2019/0266485 A1* | 8/2019 | Singh | G06N 3/063 |
| 2019/0266784 A1* | 8/2019 | Singh | G06K 9/6201 |

OTHER PUBLICATIONS

A. Radford et al., "Unsupervised Representation Learning with Deep Convolutional Generative Adversarial Networks," arXiv preprint arXiv:1511.06434, Nov. 19, 2015, 16 pages.

List of IBM Patents or Patent Applications Treated as Related.

Neogi et al., "Design Space Analysis of Novel Interconnect Constructs for 22NM FDX Technology," Proc. of SPIE, 2017, 7 pages, vol. 10148, 101480Z.

Andrey Lutich, "PatterNet: a system to learn compact physical design pattern representations for pattern-based analytics," J. Micro/Nanolith. MEMS MOEMS, Jul.-Sep. 2017, 7 pages, 16(3).

Jeon et al., "Early State Hot spot Analysis through Standard cell base randon pattern generation," Proc. of SPIE, 2017, 7 pages, vol. 10148, 101480S.

Hamouda et al., "Enhanced OPC Recipe Coverage and Early Hotspot Detection Through Automated Layout and Generation Analysis," Proc. of SPIE, 2017, 9 pages, vol. 10147, 10147R.

* cited by examiner

COORDINATES-BASED GENERATIVE ADVERSARIAL NETWORKS FOR GENERATING SYNTHETIC PHYSICAL DESIGN LAYOUT PATTERNS

BACKGROUND

The present application relates to semiconductor manufacturing, and more specifically, to techniques for patterning in semiconductor manufacturing. Patterned structures may include single layer and multi-layer structures. Each layer of a patterned structure may include a number of vias, lines and various other features. Generating and expanding layout pattern libraries for these and other features is useful for evaluating manufacturability.

SUMMARY

Embodiments of the invention provide techniques for generating synthetic physical design layout patterns.

In one embodiment, a method for generating physical design layout patterns comprises the step of selecting one or more physical design layouts, a given one of the physical design layouts for a given patterned structure comprising a set of physical design layout patterns for features in at least one layer of the given patterned structure. The method also comprises the step of converting the physical design layout patterns into coordinate arrays, a given coordinate array comprising feature center coordinates for the features in a given one of the physical design layout patterns. The method further comprises the step of training, utilizing the coordinate arrays, a generative adversarial network (GAN) comprising a discriminator neural network and a generator neural network. The method further comprises the step of generating one or more synthetic coordinate arrays utilizing the trained generator neural network of the GAN, a given one of the synthetic coordinate arrays comprising feature center coordinates of features for a new physical design layout pattern. The method is performed by at least one processing device comprising a processor coupled to a memory.

In another embodiment, a computer program product comprises a computer readable storage medium having program instructions embodied therewith. The program instructions are executable by at least one computing device to cause the at least one computing device to perform the step of selecting one or more physical design layouts, a given one of the physical design layouts for a given patterned structure comprising a set of physical design layout patterns for features in at least one layer of the given patterned structure. The program instructions are executable by the at least one computing device to cause the at least one computing device to also perform the step of converting the physical design layout patterns into coordinate arrays, a given coordinate array comprising feature center coordinates for the features in a given one of the physical design layout patterns. The program instructions are executable by the at least one computing device to cause the at least one computing device to further perform the step of training, utilizing the coordinate arrays, a GAN comprising a discriminator neural network and a generator neural network. The program instructions are executable by the at least one computing device to cause the at least one computing device to further perform the step of generating one or more synthetic coordinate arrays utilizing the trained generator neural network of the GAN, a given one of the synthetic coordinate arrays comprising feature center coordinates of features for a new physical design layout pattern.

In another embodiment, an apparatus comprises a memory and at least one processor coupled to the memory. The processor is configured for selecting one or more physical design layouts, a given one of the physical design layouts for a given patterned structure comprising a set of physical design layout patterns for features in at least one layer of the given patterned structure. The processor is also configured for converting the physical design layout patterns into coordinate arrays, a given coordinate array comprising feature center coordinates for the features in a given one of the physical design layout patterns. The processor is further configured for training, utilizing the coordinate arrays, a GAN comprising a discriminator neural network and a generator neural network. The processor is further configured for generating one or more synthetic coordinate arrays utilizing the trained generator neural network of the GAN, a given one of the synthetic coordinate arrays comprising feature center coordinates of features for a new physical design layout pattern.

These and other objects, features and advantages of the present invention will become apparent from the following detailed description of illustrative embodiments thereof, which is to be read in connection with the accompanying drawings.

BRIEF DESCRIPTION OF THE DRAWINGS

FIG. 8 depicts data preparation for converting a line layout pattern with non-uniform abutting line segment sizes to a coordinate array, according to an exemplary embodiment of the present invention.

DETAILED DESCRIPTION

Figure 1:
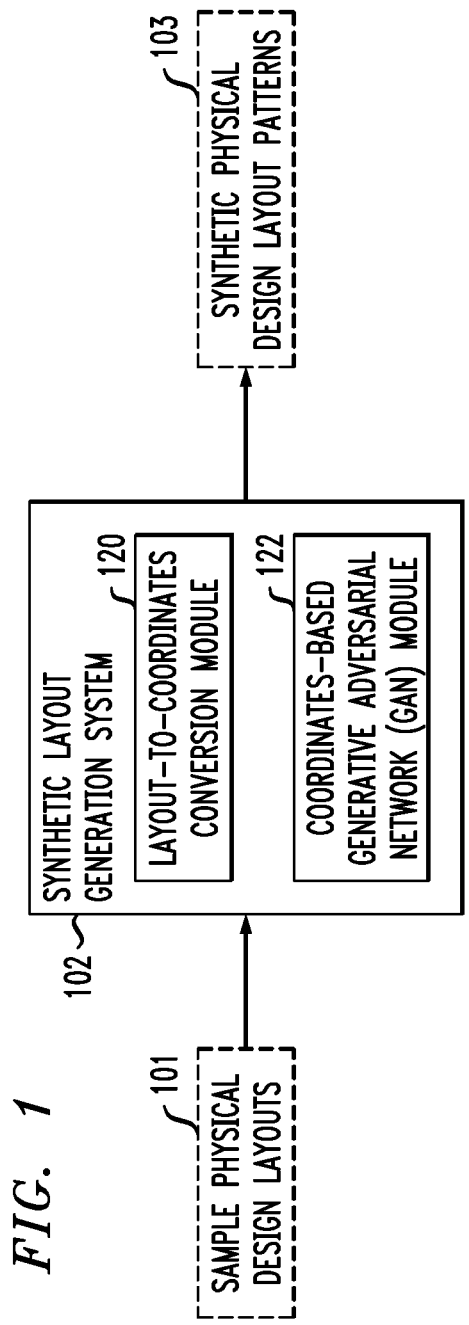
FIG. 1 depicts a system for generating synthetic layout patterns, according to an exemplary embodiment of the present invention.

Illustrative embodiments of the invention may be described herein in the context of illustrative methods, systems and devices for generating synthetic physical design layout patterns. However, it is to be understood that embodiments of the invention are not limited to the illustrative methods, systems and devices but instead are more broadly applicable to other suitable methods, systems and devices.

As discussed above, determining possible layouts for vias, lines and other features of patterned structures is useful for evaluating manufacturability. Patterned structures include structures formed in semiconductor manufacturing, which may include various materials including but not limited to semiconductors, metals, oxides, etc. in one or more layers. Generating synthetic layout patterns, as an example, can be a crucial part of early stage hot spot and failure mode analysis, especially when real layout data is limited. For example, in conducting a manufacturability study, it is generally desired to have as many design layouts as possible.

In some scenarios, a design manual is defined and provided for design rule checking (DRC). Generating synthetic layout patterns in such scenarios may involve generating as many DRC-clean or DRC-compliant layout patterns as possible to evaluate manufacturability.

In other scenarios, only limited real physical design layout data is provided as input. Generating synthetic layout patterns in such scenarios may include generating layout patterns that look similar to but are not the same as the input or real data, so as to expand a layout pattern library, evaluate manufacturability, etc. It should be appreciated that some embodiments may combine these and other scenarios.

One way to generate layout patterns is to use Electronic Design Automation (EDA) tools or other software. Such tools and software, however, are generally limited in that pattern generation is based on predefined building blocks and hardcoded rules to generate reasonable layout patterns. Another way to generate layout patterns is through manual scripting and polygon maneuvering by human pattern designers. Such approaches, however, are limited by the designers' understanding of layouts and are limited in generating large-scale synthetic data. These and other approaches require significant manual effort (e.g., human manipulations), which is error prone and has limited scalability.

Embodiments provide techniques for generating synthetic physical design layout patterns that overcome these and other disadvantages, through building a model based on generative adversarial networks (GANs). Such a model may be used to automatically generate, in any scale, synthetic physical design layout patterns that look like real or input layout patterns thus expanding pattern libraries. In some embodiments, physical design layouts are converted to a data format suitable for input to a GAN, such as one based on center coordinates of features as described in further detail below.

Advantageously, GANs are used in some embodiments to produce realistic physical design layout patterns, as GANs can produce synthetic data that looks like real data. Embodiments also provide advantages through automation, which removes the need for human intervention in inference (e.g., generation of synthetic data) after training the GAN model. GAN models used in some embodiments further provide scalability, as trained GANs can generate new patterns quickly. The use of a GAN model further provides for cumulative learning, in that the GAN model becomes more versatile with more diverse real data as training input. GAN models described herein may find use in various application areas, such as for EDA, semiconductor foundries, etc.

GANs are a type of neural network that includes two networks, a generator (generative) network and a discriminator (adversarial) network. The generator network takes random input values and transforms them into a desired output, such as a synthetic layout pattern. A synthetic layout pattern in some embodiments takes the form of a coordinate array indicating the center coordinates of a set of features (e.g., vias, lines or line segments, etc.) in a single layer of a patterned structure.

The discriminator network distinguishes between real and synthetic data, or between real and synthetic layout patterns. After training the generator and discriminator networks competitively, neither network should be able to make further progress against the other. In other words, at the end of training the generator network becomes so good that the discriminator network cannot distinguish between the coordinate arrays of real and synthetic layout patterns. During inference, the generator network can be used as a standalone model to generate coordinate arrays of new synthetic layout patterns, which will be similar to real or input layout patterns.

Embodiments provide for data preparation such that physical design layout patterns may be input to a GAN. In some embodiments, the input for a GAN is an array of center coordinates for features in a layout pattern. Features may include, by way of example, vias, lines (or segments thereof) in at least one layer of a patterned structure. The center coordinates may be provided with feature locations ordered in a consistent way, such as from left to right and then from bottom to top in a field of view (FOV). Each coordinate array may have a size of M×N, where M is the number of values required to represent the center of a feature in a given coordinate system and where N is the maximum number of features in the FOV. Various embodiments are described herein with respect to center coordinates represented in a Cartesian coordinate system (e.g., where M is 2 for the x- and y-axis of layouts). It should be appreciated, however, that various other coordinate systems may be used as desired, possibly with different values of M. An array with fewer than N features may be padded with null values (e.g., 0) that are outside the range of possible coordinates for the FOV.

FIG. 1 shows a system 102 for generating synthetic layouts. The system 102 includes a layout-to-coordinates conversion module 120 and a coordinates-based GAN module 122. The layout-to-coordinates conversion module 120, also referred to as conversion module 120, provides data preparation functionality for sample physical design layouts 101 received as input to the system 102. The conversion module 120, for example, may convert a given physical design layout into coordinate arrays for different layout patterns thereof (e.g., for different fields of view of the given physical design layout) as described above and elsewhere herein.

The conversion module 120 provides appropriately formatted or converted physical layout patterns (e.g., coordinate arrays of feature center coordinates) to the coordinates-based GAN module 122. The coordinates-based GAN module 122 may be trained on the input (e.g., coordinate arrays for physical design patterns of the sample physical design layouts 101). After training, the coordinates-based GAN module 122 uses the generator network to generate synthetic physical design layout patterns 103 as output. In some embodiments, the synthetic physical design layout patterns 103 may be in a desired format as described in further detail below (e.g., suitably converted from a coordinate array output by the generator network of the GAN). Thus, the output of the coordinates-based GAN module 122 may be provided back to the conversion module 120 for a conversion from a coordinate array to a desired layout pattern format.

Figure 2:
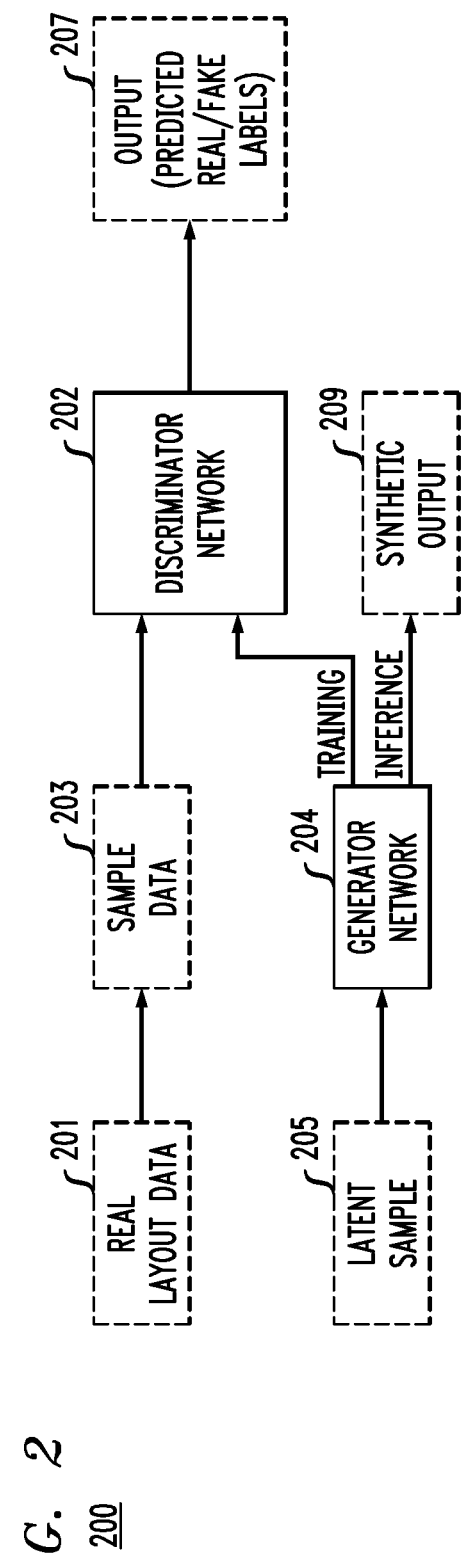
FIG. 2 depicts a workflow of a generative adversarial neural network, according to an exemplary embodiment of the present invention.

FIG. 2 shows an example workflow of using a GAN 200, which includes a discriminator network 202 and a generator network 204. Real layout data 201 is provided as input, which may be converted into sample data 203 prior to being provided to the discriminator network 202. The layout-to-coordinates conversion described above is an example of conversion from real layout data 201 to sample data 203. Latent sample data 205, which may take the form of randomly-generated information (e.g., a noise vector) is provided to the generator network 204.

The generator network 204, during training, provides generated or synthetic data to the discriminator network 202. The discriminator network 202 compares the synthetic data with the sample data 203, and outputs predicted labels 207 that distinguish between "real" (e.g., sample data 203) and "fake" (e.g., synthetic data from the generator network 202).

After training, the concept of the GAN is that the generator network 204 will become so good at generating synthetic data that the discriminator network 202 will not be able to distinguish between the sample data 203 and the synthetic data from the generator network 204. Thus, during inference the trained generator network 204 produces synthetic output 209 that is similar to the sample data 203, or not distinguishable from the real layout data 201 from the perspective of the discriminator network 202.

Figure 3:
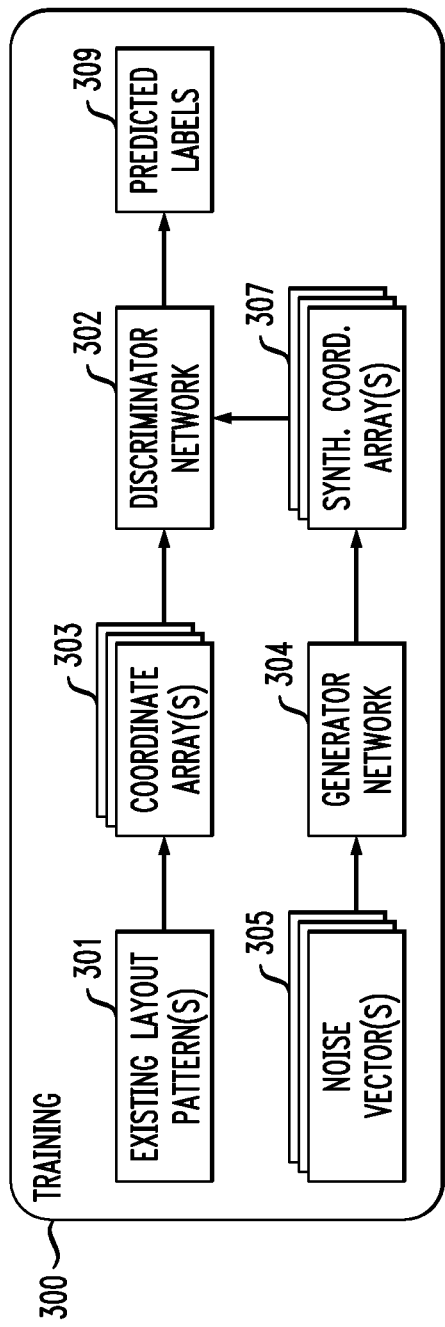
FIG. 3 depicts a training workflow of a generative adversarial neural network, according to an exemplary embodiment of the present invention.

FIG. 3 shows a more detailed view of a training workflow 300 of a GAN. During training, existing layout patterns 301 are provided as the input or real data, and are converted to coordinate arrays 303 suitable for processing by discriminator network 302. Noise vectors 305 are provided to generator network 304, which generates synthetic coordinate arrays 307 provided to the discriminator network 302. The discriminator network 302 outputs predicted labels 309 for the coordinate arrays 303 and synthetic coordinate arrays 307 (e.g., indicating whether the discriminator network 302 views respective ones of each as "real" or "fake"). The discriminator network 302 and generator network 304 are optimized simultaneously, until the discriminator network 302 is unable to distinguish between the "real" and "fake" data, or between the coordinate arrays 303 and synthetic coordinate arrays 307.

It should be noted that optimizing or tuning the GAN comprising discriminator network 302 and generator network 304, unlike other types of neural network architectures, is not necessarily limited to using a single accuracy or performance target for optimization. Instead, in some embodiments optimizing the discriminator network 302 and generator network 304 of the GAN seeks to achieve a balance between performance of the discriminator network 302 and generator network 304. In some embodiments, "optimization" or the discriminator network 302 not being able to distinguish between "real" and "fake" data may be subject to some threshold level of accuracy in the predicted labels 309, and is not meant to imply that after training the discriminator network 302 is never able to successfully recognize that one or more of the synthetic coordinate arrays 307 produced by generator network 304 is "fake."

Figure 4:
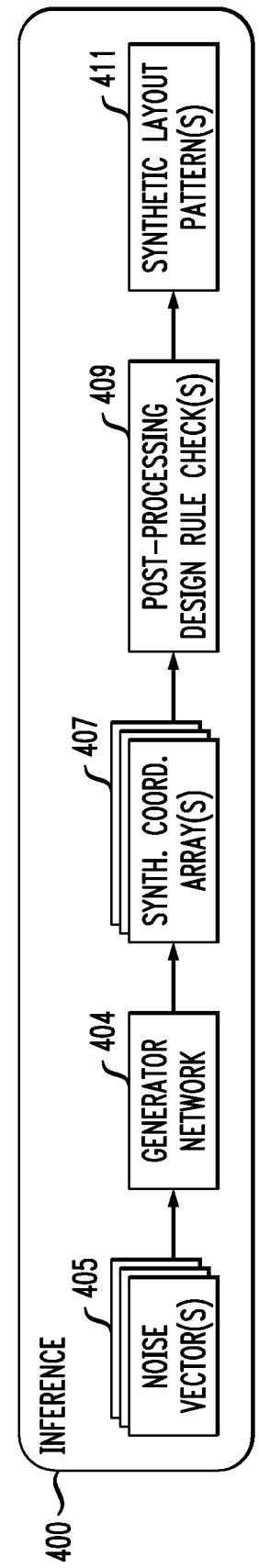
FIG. 4 depicts an inference workflow using a trained generative adversarial neural network, according to an exemplary embodiment of the present invention.

FIG. 4 shows a more detailed view of an inference workflow 400 using a GAN, or more particularly the generator network 404 of a GAN. Similar to training 300 described above, noise vectors 405 are provided to the generator network 404, which generates synthetic coordinate arrays 407. The synthetic coordinate arrays 407 produced during inference 400, however, are not compared against real data by a discriminator network as it is assumed that the trained generator network 404 is good enough to "fool" the discriminator network of the GAN and thus there is no need to pass the synthetic coordinate arrays 407 to the discriminator network. Instead, the synthetic coordinate arrays 407 are provided for post-processing 409, such as design rule checking. The design rule checks 409 may ensure that the synthetic coordinate arrays 407 produced by the generator network 404 meet specified design rules for layout patterns in a particular use case that may not be captured during training 300. In some embodiments, feature sizes (e.g., via sizes, line segment sizes, etc.) are assumed to be fixed (e.g., known width and height), and thus the design rule checks 409 include determining whether the center coordinates of the features in the synthetic coordinate arrays 407 violate any design rules. For example, this may include checking whether the absolute distance between the x- or y-coordinates of two features exceed some designated threshold, or that abs(x1−x2)>xthreshold or abs (y1−y2)>ythreshold.

After post-processing design rule checks 409, synthetic layout patterns 411 are provided. The synthetic layout patterns 411 may be converted from the synthetic coordinate arrays 407 into suitable formats for further processing. In some embodiments, the synthetic layout patterns 411 are provided in Open Artwork System Interchange Standard (OASIS) format (.oas) or Graphic Database System (GDS) format (.gds) as desired. Conversion from OAS/GDS format to coordinates can be performed using EDA software, which may export coordinates of polygon vertices. Alternatively, some math may be applied to the coordinates of the polygon vertices to get coordinates of corresponding polygon (e.g., via) centers. The input data, which may be in the OASIS or GDS layout format, may similarly be converted to obtain feature center coordinates.

Figure 6:
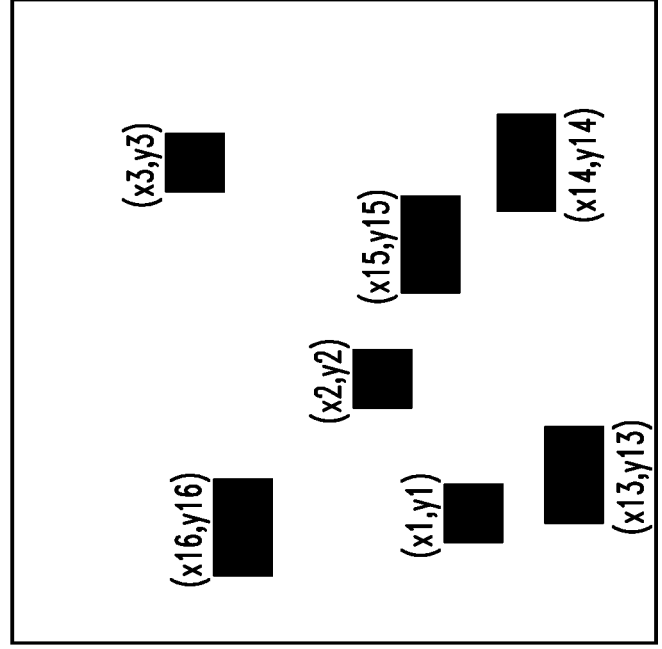
FIG. 6 depicts data preparation for converting a via layout pattern with non-uniform via size to a coordinate array, according to an exemplary embodiment of the present invention.
Figure 7:
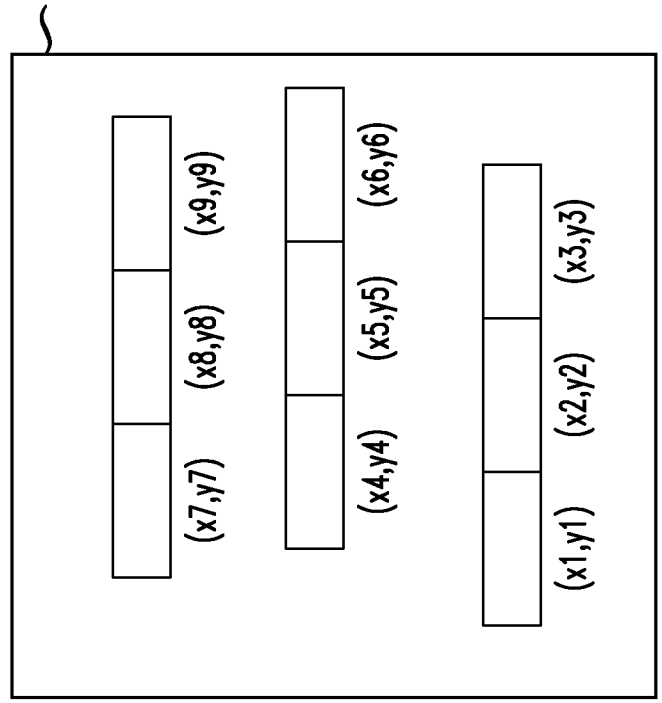
FIG. 7 depicts data preparation for converting a line layout pattern to a coordinate array, according to an exemplary embodiment of the present invention.

As described above, input data (e.g., sample physical design layouts 101, real layout data 201, existing layout patterns 301) may be converted into a format suitable for use in the GAN. Examples of such conversion will now be described with respect to FIGS. 5-8. FIGS. 5A-5E and 6 illustrate conversion of via layout patterns to arrays of via center coordinates. FIGS. 7 and 8 illustrate conversion of line layout patterns to arrays of line segment center coordinates. It should be appreciated, however, that various other types of features of a physical design layout may be similarly converted to coordinate arrays.

Figure 5A:
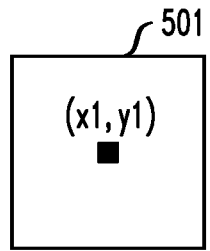
FIG. 5A depicts data preparation for converting a via layout pattern to a coordinate array, according to an exemplary embodiment of the present invention.

In the FIGS. 5A-5E examples, it is assumed that the FOV has a maximum of 25 possible vias (e.g., where N is 25). Thus, each coordinate array is a coordinate vector of length 50 (2*25), or a coordinate matrix of size 2×25 or 25×2. FIG. 5A shows a layout 501 including a single via having via center coordinates (x1, y1). The layout 501 is converted to coordinate array 510 as shown. For example, the coordinate array 510 is of size 2*25, where the first row of 25 entries are reserved for the x-coordinates of via centers and the second row of 25 entries are reserved for the y-coordinates of the via centers. It should be appreciated that for smaller or larger values of N representing the maximum possible vias in a FOV, the number of entries reserved for the x- and y-coordinates of the via centers is varied accordingly. Since the layout 501 has only a single via, the coordinate array 510 is padded with null or 0 values outside the range of possible via coordinates for the remaining entries, or all entries except for the first positions x1 and y1.

Figure 5B:
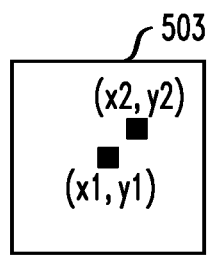
FIG. 5B depicts data preparation for converting another via layout pattern to a coordinate array, according to an exemplary embodiment of the present invention.
Figure 5C:
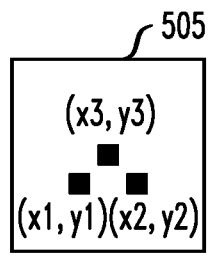
FIG. 5C depicts data preparation for converting another via layout pattern to a coordinate array, according to an exemplary embodiment of the present invention.
Figure 5D:
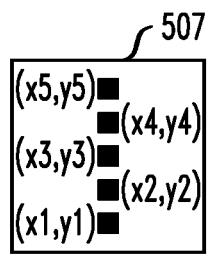
FIG. 5D depicts data preparation for converting another via layout pattern to a coordinate array, according to an exemplary embodiment of the present invention.
Figure 5E:
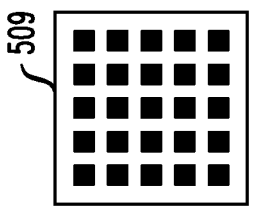
FIG. 5E depicts data preparation for converting another via layout pattern to a coordinate array, according to an exemplary embodiment of the present invention.

FIG. 5B shows a layout 503 with two vias and a corresponding coordinate array 530 with values for x1, x2, y1, y2 and the rest of the entries padded with zero. FIGS. 5C-5E show additional layouts 505, 507 and 509, respectively, and corresponding coordinate arrays 550, 570 and 590. The layouts 505 and 507 include three and five vias, respectively, with appropriate padding in the coordinate arrays 550 and 570. The layout 509 represents one with the maximum number of vias, such that there is no padding required in the coordinate array 590.

As mentioned above, the examples of FIGS. 5A-5E assume that each via has a fixed size (e.g., a fixed width and/or height). Embodiments can also provide conversion for layouts that include vias of different sizes as illustrated by FIG. 6. FIG. 6 shows a layout 601 including a first set of vias with coordinates (x1,y1), (x2,y2) and (x3, y3) of a first size and a second set of vias with coordinates (x13,y13), (x14,y14), (x15,y15) and (x16,y16) of a second size. It should be appreciated that the particular number of vias of each size may vary. A layout may include any desired numbers of vias of different sizes, subject to the maximum permissible number of vias for a corresponding FOV. The layout 601 is converted to coordinate array 610 as shown, where the center coordinates of the vias of the first size are represented in positions 1-12 of a first row for x-coordinates and of a second row for y-coordinates, with appropriate padding. The center coordinates of the vias of the second size are represented in positions 13-24 of the first row for x-coordinates and of the second row for y-coordinates, again with appropriate padding.

For layouts with more than two different sizes of vias, the coordinate array may be further extended with designated positions for vias of additional sizes. It should also be appreciated that the number of designated positions need not be the same for vias of each size. For example, the maximum number of vias in a FOV may be dependent on the size of the vias. Since a larger number of "smaller" vias may fit within a FOV relative to "larger" vias, the coordinate array may be structured such that the designated number of positions for each via size corresponds to the maximum number of vias of that size which can fit in the FOV.

In the FIG. 7 example, it is assumed that the FOV has a maximum of 25 possible line segments (e.g., where N is 25). Thus, each coordinate array is a coordinate vector of length 50 (2*25), or a coordinate matrix of size 2×25 or 25×2. FIG. 7 shows a layout 701 including a set of lines represented as abutting line segments of fixed size. More particularly, the layout 701 includes three lines. A first line is formed by abutting line segments having center coordinates (x1,y1), (x2,y2) and (x3,y3). A second line is formed by abutting line segments having center coordinates (x4,y4), (x5,y5) and (x6,y6). A third line is formed by abutting line segments having center coordinates (x7,y7), (x8,y8) and (x9,y9). Although in FIG. 7 each of the three lines is formed from three abutting fixed-size line segments, this is just an example. Different numbers of lines may be formed, with each line being formed from different numbers of fixed-size line segments (e.g., a first line may be formed from two fixed-size line segments while a second line may be formed from one or more than two fixed-size line segments, etc.). The layout 701 is converted to coordinate array 710 as shown. For example, the coordinate array 710 is of size 2*25, where the first row of 25 entries are reserved for the x-coordinates of line segment centers and the second row of 25 entries are reserved for the y-coordinates of the line segment centers. It should be appreciated that for smaller or larger values of N representing the maximum possible vias in a FOV, the number of entries reserved for the x- and y-coordinates of the line segment centers is varied accordingly. Since the layout 701 has only nine line segments, the coordinate array 710 is padded with null or 0 values outside the range of possible via coordinates for the remaining entries, or all entries except for the positions of x1 through x9 and y1 through y9.

As mentioned above, the FIG. 7 example assumes that each line segment has a fixed size (e.g., a fixed width and/or height). Embodiments can also provide conversion for layouts that include line segments of different sizes as illustrated by FIG. 8. FIG. 8 shows a layout 801 including a first set of line segments of a first size having center coordinates (x1,y1), (x2,y2), (x3,y3), (x4,y4) and (x5,y5) and a second set of line segments of a second size having center coordinates (x13,y13) and (x14,y14). It should be appreciated that the particular number of line segments of each size may vary. A layout may include any desired numbers of line segments of different sizes, subject to the maximum permissible number of line segments for a corresponding FOV. The layout 801 is converted to coordinate array 810 as shown, where the center coordinates of the line segments of the first size are represented in positions 1-12 of a first row for x-coordinates and of a second row for y-coordinates, with appropriate padding. The center coordinates of the line segments of the second size are represented in positions 13-24 of the first row for x-coordinates and of the second row for y-coordinates, again with appropriate padding.

For layouts with more than two different sizes of line segments, the coordinate array may be further extended with designated positions for line segments of additional sizes. It should also be appreciated that the number of designated positions need not be the same for line segments of each size. For example, the maximum number of line segments in a FOV may be dependent on the size of the line segments. Since a larger number of "smaller" line segments may fit within a FOV relative to "larger" line segments, the coordinate array may be structured such that the designated number of positions for each line segment size corresponds to the maximum number of line segments of that size which can fit in the FOV.

Figure 9:
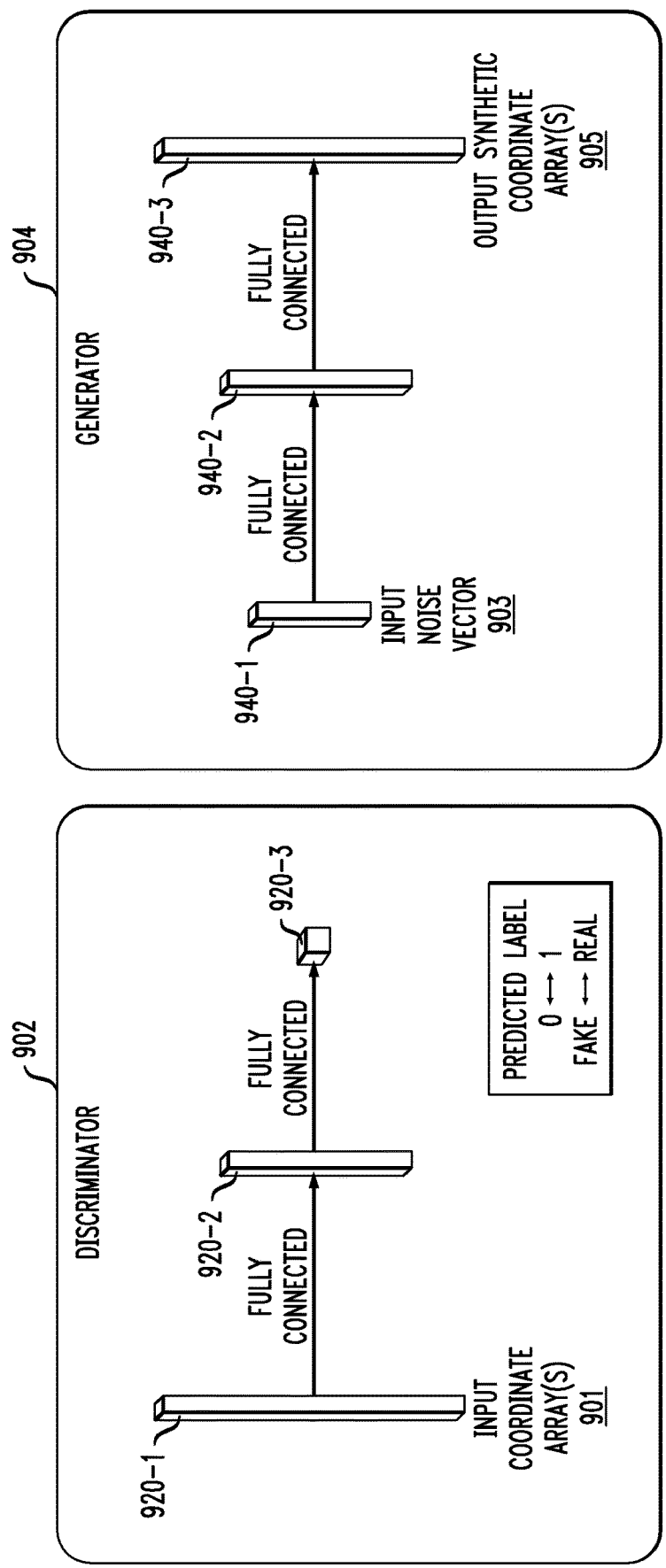
FIG. 9 depicts an architecture of a generative adversarial neural network, according to an exemplary embodiment of the present invention.

FIG. 9 shows an architecture of a GAN where the discriminator network 902 and generator network 904 are implemented as fully connected neural networks (NNs). It should be appreciated, however, that various other architectures for a GAN may be used in other embodiments, such as convolutional neural networks (CNNs), recurrent neural networks (RNNs), etc.

In the FIG. 9 example, the discriminator network 902 receives input coordinate arrays 901 that are provided to a first fully connected layer 920-1. The first fully connected layer 920-1 provides output to a second fully connected layer 920-2. The second fully connected layer 920-2 provides output to a third fully connected layer 920-3, which provides predicted labels of the input coordinate arrays 901 as output. For the predicted labels, a value of 0 corresponds to a "fake" label while a value of 1 corresponds to a "real" label. The generator network 904 takes as input a noise vector 903, and passes the input through a series of fully connected layers 940-1, 940-2 and 940-3 to generate synthetic coordinate arrays 905 as output.

The fully connected NN architectures of discriminator network 902 and generator network 904 are examples of "deep learning" or "deep neural networks" which include many successive layers of representations. GANs are a type of deep neural network which uses multiple layers to accurately extract features in the input data (e.g., to provide automatic "feature extraction"). Although the FIG. 9 example uses multiple fully connected neural network layers, it should be appreciated that other types of neural network architectures (e.g., CNNs, RNNs) may use multiple layers of another type (e.g., multiple convolutional layers, multiple recurrent layers, etc.)

It should again be noted that the particular architecture shown in FIG. 9 is presented by way of example only, and that embodiments are not limited to use of the specific examples shown for the discriminator network 902 and generator network 904. Hyperparameters (e.g., number of neural network layers, type of neural network layers, numbers of neurons for each neural network layer, etc.) for GANs (e.g., the discriminator and generator neural networks thereof) can vary as desired. In some embodiments, the particular values for the hyperparameters are based on factors such as the input coordinates of the via layouts, training accuracy targets, available computing hardware, etc.

In some embodiments, synthetic via layout patterns are generated by a GAN. Physical design layouts (which may be in an OASIS or GDS format) with a variety of via layout patterns are selected for training the GAN. The physical design layout patterns are converted into a set of coordinate arrays for input to the GAN as training data. In some embodiments, the GAN is built using Python and Tensorflow, an open-source deep learning library. The GAN is then trained using the training data, with fine-tuning of the hyperparameters of the GAN (e.g., the discriminator and generator networks thereof) to achieve desired results. After training, the generator network of the GAN is used to generate synthetic via layouts.

Embodiments may further provide techniques as described herein for converting between the data format of the GAN (e.g., coordinate arrays of via center coordinates) and layout patterns (e.g., in OASIS or GDS format). The input or real data is converted from the layout patterns to the GAN data format, and the output of the GAN is converted from the GAN data format to layout patterns. The output of the GAN may be further subject to post-processing methods to remove DRC violations in the output coordinate arrays prior to conversion to the layout format.

Figure 10:
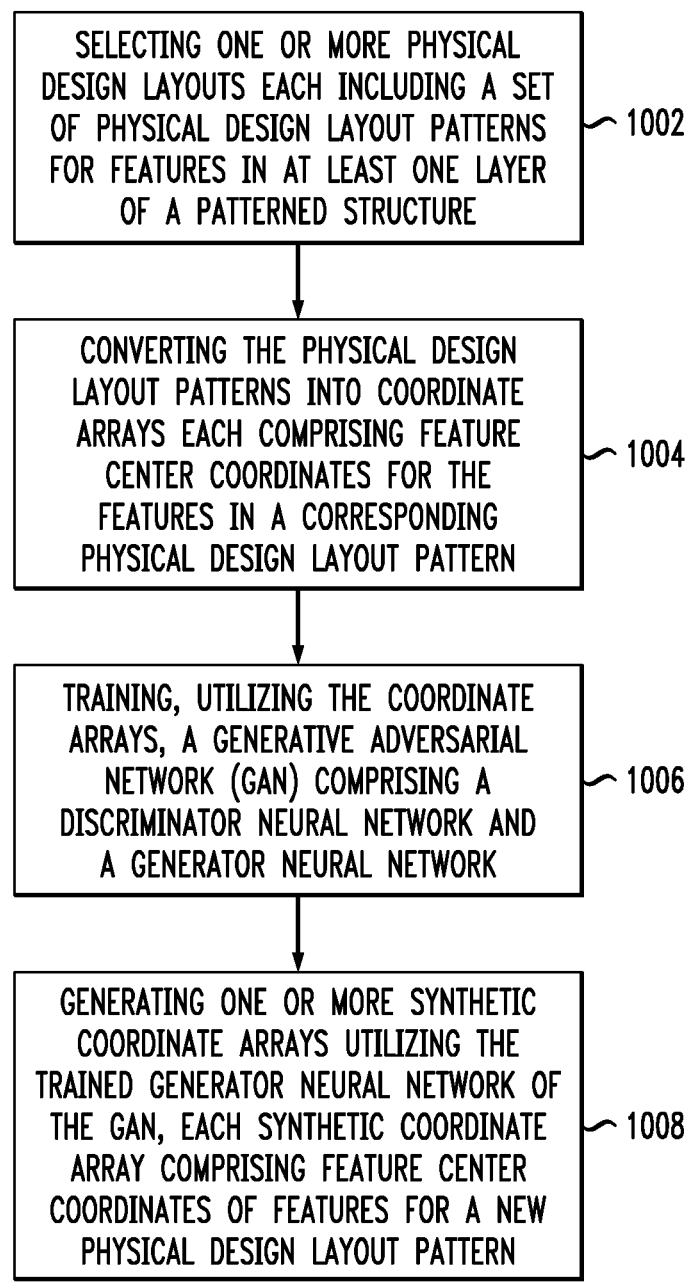
FIG. 10 depicts a workflow for generating synthetic layout patterns, according to an exemplary embodiment of the present invention.

FIG. 10 depicts a workflow 1000 for generating synthetic layout patterns, such as for features in at least one layer of a patterned structure. The features may include vias, lines, etc. The workflow 1000 begins with step 1002, selecting one or more physical design layouts. Each physical design layout for a patterned structure may include a set of physical design layout patterns (e.g., for different FOVs of that physical design layout) for features in at least one layer of the patterned structure.

In step 1004, the physical design layout patterns are converted into coordinate arrays. Each coordinate array comprises feature center coordinates for features in a corresponding one of the physical design layout patterns. The coordinate arrays in some embodiments have a size of M*N as described above. The features may be fixed-size rectangular features, with the coordinate arrays having designated entries for respective ones of the centers of the fixed-size rectangular features.

In step 1006, a GAN is trained utilizing the coordinate arrays. The GAN includes a discriminator neural network and a generator neural network. In some embodiments, one or both of the discriminator and generator neural networks may be fully connected neural networks comprising a series of fully connected neural network layers. In other embodiments, one or both of the discriminator and generator neural networks may be CNNs, RNNs, etc.

In step 1008, one or more synthetic coordinate arrays are generated utilizing the trained generator neural network of the GAN. Each of the synthetic coordinate arrays may comprise feature center coordinates of features for a new physical design layout pattern. Step 1008 in some embodiments further includes applying post-processing to the generated synthetic coordinate arrays using one or more design rule checks and converting the generated synthetic coordinate arrays to a format used in an electronic design automation (EDA) software. Step 1008 in some embodiments may also include utilizing the synthetic coordinate arrays to evaluate manufacturability of the new physical design layout patterns.

Embodiments of the present invention include a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a standalone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Figure 11:
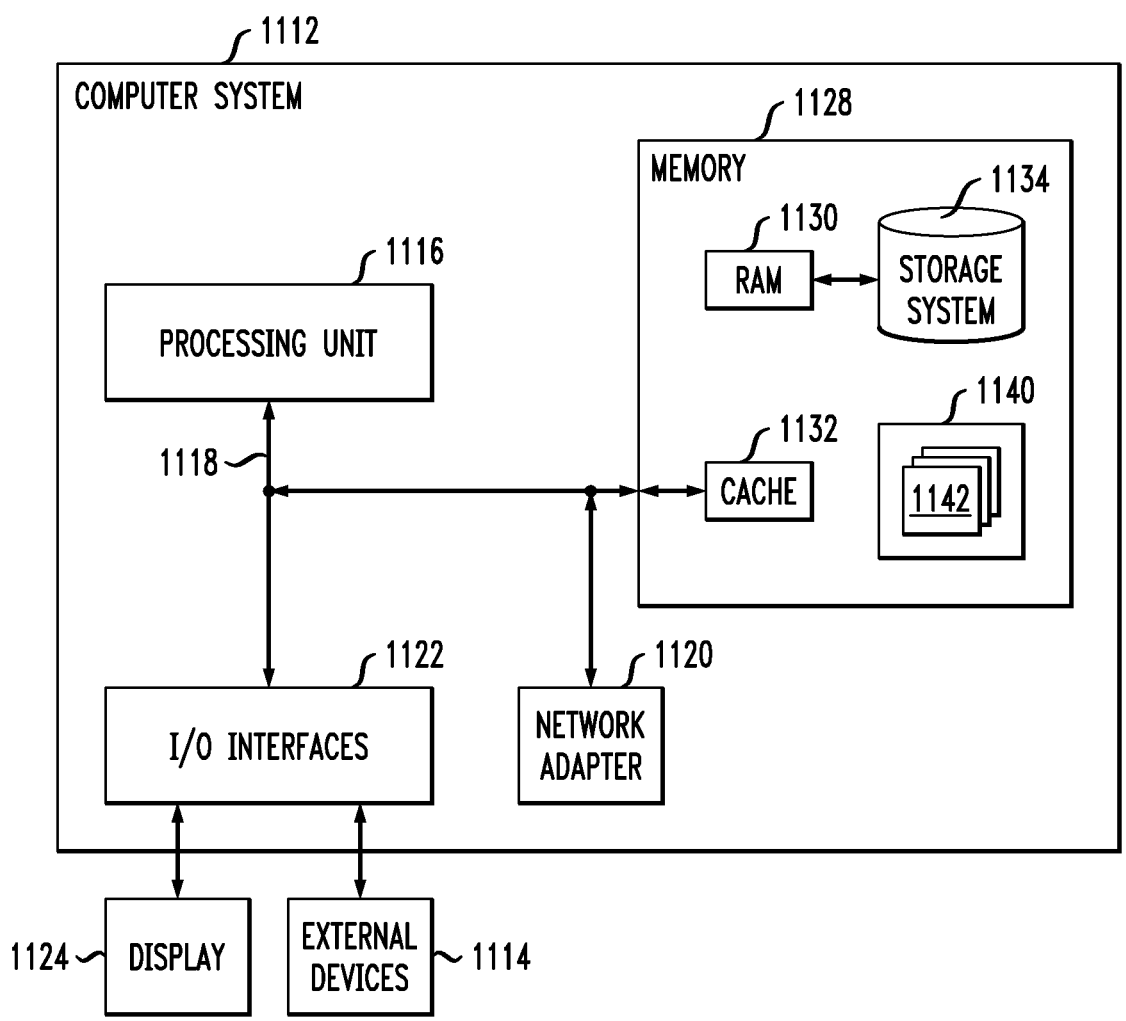
FIG. 11 depicts a computer system in accordance with which one or more components/steps of techniques of the invention may be implemented, according to an exemplary embodiment of the invention.

One or more embodiments can make use of software running on a general-purpose computer or workstation. With reference to FIG. 11, in a computing node 1110 there is a computer system/server 1112, which is operational with numerous other general purpose or special purpose computing system environments or configurations. Examples of well-known computing systems, environments, and/or configurations that may be suitable for use with computer system/server 1112 include, but are not limited to, personal computer systems, server computer systems, thin clients, thick clients, handheld or laptop devices, multiprocessor systems, microprocessor-based systems, set top boxes, programmable consumer electronics, network PCs, minicomputer systems, mainframe computer systems, mobile and wearable devices, and distributed cloud computing environments that include any of the above systems or devices, and the like.

Computer system/server 1112 may be described in the general context of computer system executable instructions, such as program modules, being executed by a computer system. Generally, program modules may include routines, programs, objects, components, logic, data structures, and so on that perform particular tasks or implement particular abstract data types. Computer system/server 1112 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 11, computer system/server 1112 in computing node 1110 is shown in the form of a general-purpose computing device. The components of computer system/server 1112 may include, but are not limited to, one or more processors or processing units 1116, a system memory 1128, and a bus 1118 that couples various system components including system memory 1128 to processor 1116.

The bus 1118 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

The computer system/server 1112 typically includes a variety of computer system readable media. Such media may be any available media that is accessible by computer system/server 1112, and it includes both volatile and non-volatile media, removable and non-removable media.

The system memory 1128 can include computer system readable media in the form of volatile memory, such as random access memory (RAM) 1130 and/or cache memory 1132. The computer system/server 1112 may further include other removable/non-removable, volatile/nonvolatile computer system storage media. By way of example only, storage system 1034 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to the bus 1118 by one or more data media interfaces. As depicted and described herein, the memory 1128 may include at least one program product having a set (e.g., at least one) of program modules that are configured to carry out the functions of embodiments of the invention. A program/utility 1140, having a set (at least one) of program modules 1142, may be stored in memory 1128 by way of example, and not limitation, as well as an operating system, one or more application programs, other program modules, and program data. Each of the operating system, one or more application programs, other program modules, and program data or some combination thereof, may include an implementation of a networking environment. Program modules 1142 generally carry out the functions and/or methodologies of embodiments of the invention as described herein.

Computer system/server 1112 may also communicate with one or more external devices 1114 such as a keyboard, a pointing device, a display 1124, etc., one or more devices that enable a user to interact with computer system/server 1112, and/or any devices (e.g., network card, modem, etc.) that enable computer system/server 1112 to communicate with one or more other computing devices. Such communication can occur via I/O interfaces 1122. Still yet, computer system/server 1112 can communicate with one or more networks such as a LAN, a general WAN, and/or a public network (e.g., the Internet) via network adapter 1120. As depicted, network adapter 1120 communicates with the other components of computer system/server 1112 via bus 1118. It should be understood that although not shown, other hardware and/or software components could be used in conjunction with computer system/server 1112. Examples include, but are not limited to, microcode, device drivers, redundant processing units, external disk drive arrays, RAID systems, tape drives, and data archival storage systems, etc.

It is to be understood that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g., networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported, providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure that includes a network of interconnected nodes.

Figure 12:
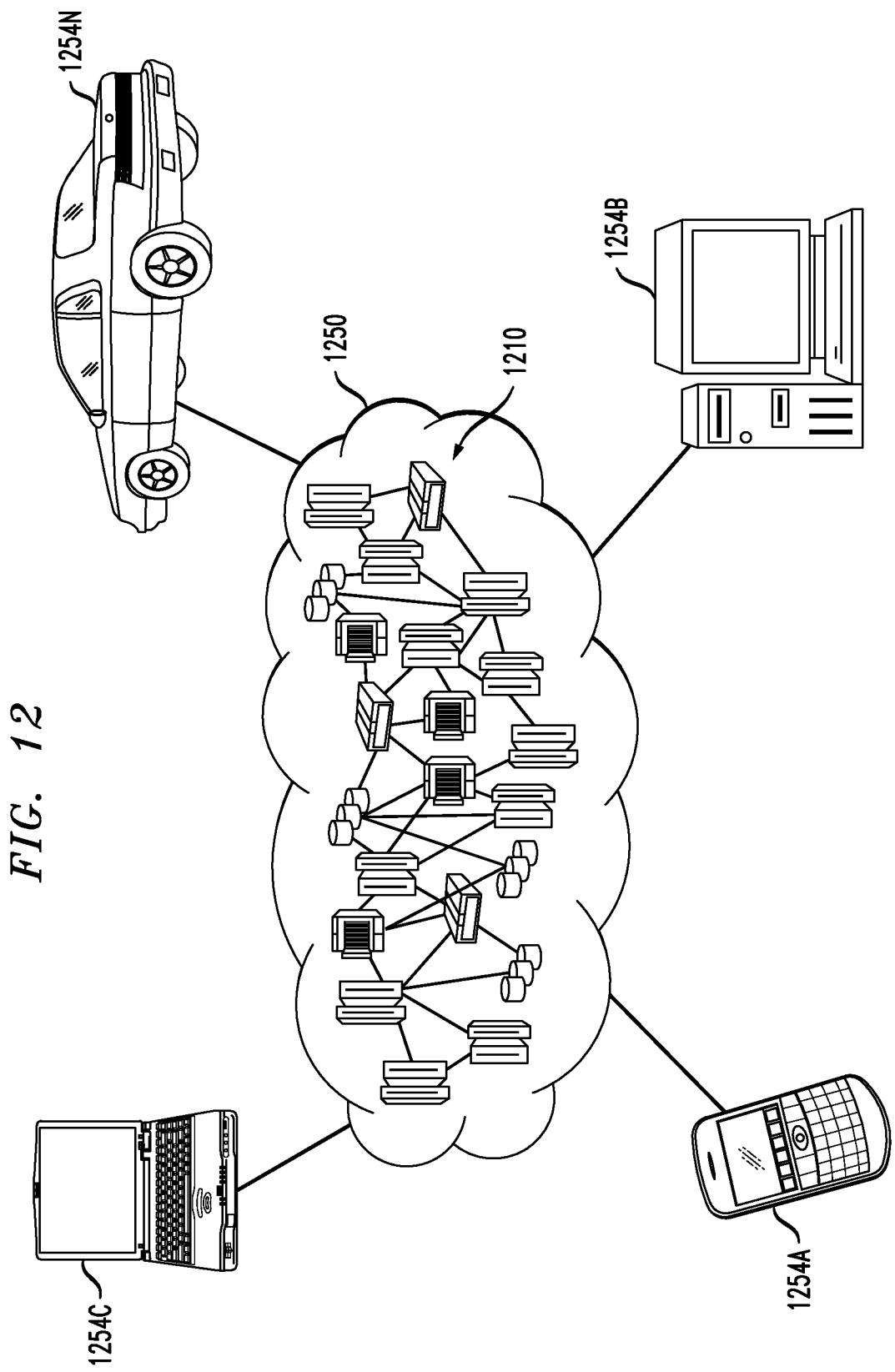
FIG. 12 depicts a cloud computing environment, according to an exemplary embodiment of the present invention.

Referring now to FIG. 12, illustrative cloud computing environment 1250 is depicted. As shown, cloud computing environment 1250 includes one or more cloud computing nodes 1210 with which local computing devices used by cloud consumers, such as, for example, personal digital assistant (PDA) or cellular telephone 1254A, desktop computer 1254B, laptop computer 1254C, and/or automobile computer system 1254N may communicate. Nodes 1210 may communicate with one another. They may be grouped (not shown) physically or virtually, in one or more networks, such as Private, Community, Public, or Hybrid clouds as described hereinabove, or a combination thereof. This allows cloud computing environment 1250 to offer infrastructure, platforms and/or software as services for which a cloud consumer does not need to maintain resources on a local computing device. It is understood that the types of computing devices 1254A-N shown in FIG. 12 are intended to be illustrative only and that computing nodes 1210 and cloud computing environment 1250 can communicate with any type of computerized device over any type of network and/or network addressable connection (e.g., using a web browser).

Figure 13:
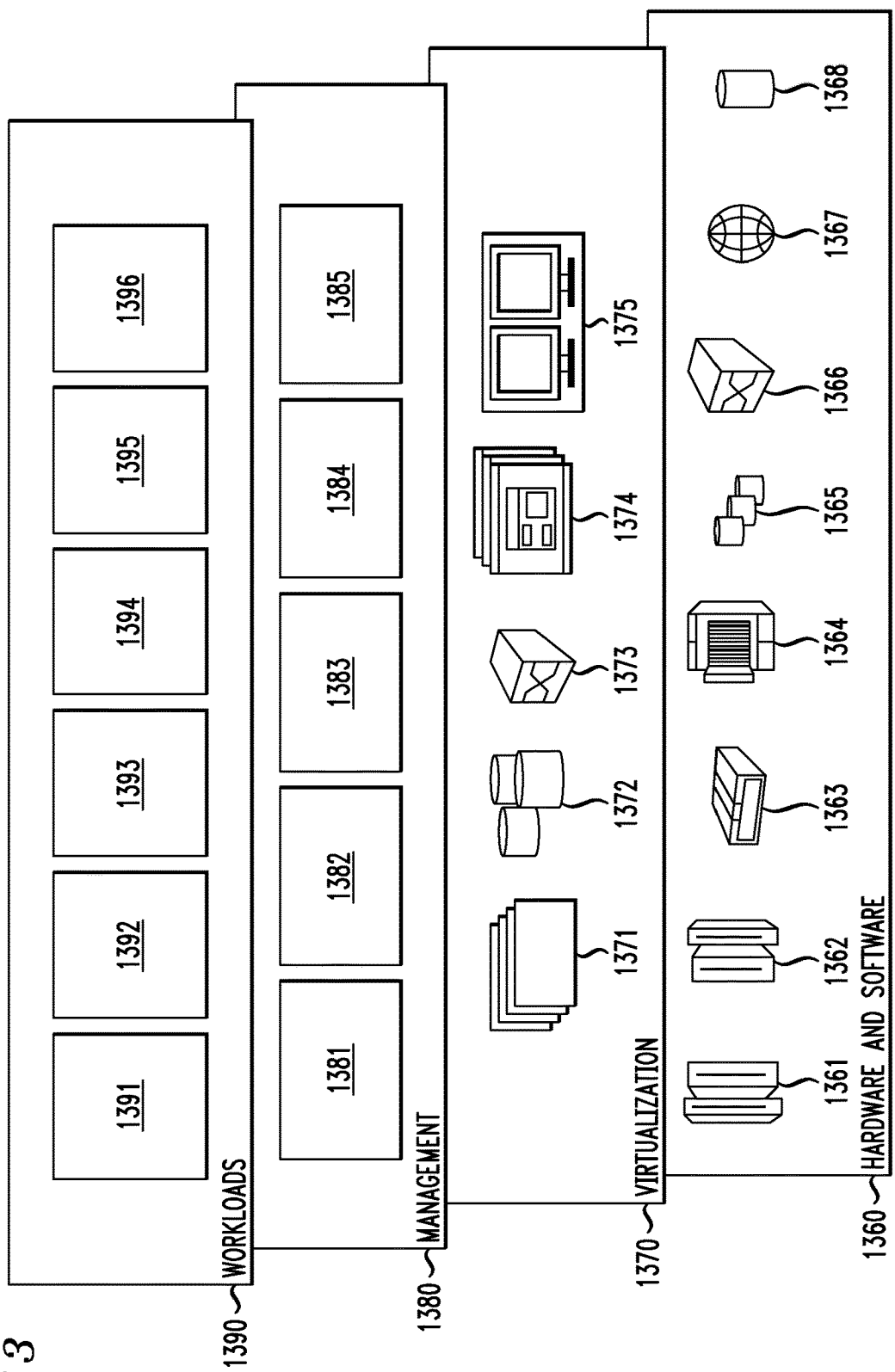
FIG. 13 depicts abstraction model layers, according to an exemplary embodiment of the present invention.

Referring now to FIG. 13, a set of functional abstraction layers provided by cloud computing environment 1250 (FIG. 12) is shown. It should be understood in advance that the components, layers, and functions shown in FIG. 13 are intended to be illustrative only and embodiments of the invention are not limited thereto. As depicted, the following layers and corresponding functions are provided:

Hardware and software layer 1360 includes hardware and software components. Examples of hardware components include: mainframes 1361; RISC (Reduced Instruction Set Computer) architecture based servers 1362; servers 1363; blade servers 1364; storage devices 1365; and networks and networking components 1366. In some embodiments, software components include network application server software 1367 and database software 1368.

Virtualization layer 1370 provides an abstraction layer from which the following examples of virtual entities may be provided: virtual servers 1371; virtual storage 1372; virtual networks 1373, including virtual private networks; virtual applications and operating systems 1374; and virtual clients 1375.

In one example, management layer 1380 may provide the functions described below. Resource provisioning 1381 provides dynamic procurement of computing resources and other resources that are utilized to perform tasks within the cloud computing environment. Metering and Pricing 1382 provide cost tracking as resources are utilized within the cloud computing environment, and billing or invoicing for consumption of these resources. In one example, these resources may include application software licenses. Security provides identity verification for cloud consumers and tasks, as well as protection for data and other resources. User portal 1383 provides access to the cloud computing environment for consumers and system administrators. Service level management 1384 provides cloud computing resource allocation and management such that required service levels are met. Service Level Agreement (SLA) planning and fulfillment 1385 provide pre-arrangement for, and procurement of, cloud computing resources for which a future requirement is anticipated in accordance with an SLA.

Workloads layer 1390 provides examples of functionality for which the cloud computing environment may be utilized. Examples of workloads and functions which may be provided from this layer include: mapping and navigation 1391; software development and lifecycle management 13292; virtual classroom education delivery 1393; data analytics processing 1394; transaction processing 1295; and synthetic via layout generation processing 1396, which may perform various functions described above with respect to generating synthetic via layouts using the techniques described herein.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for generating physical design layout patterns, comprising steps of:

selecting one or more physical design layouts, a given one of the physical design layouts for a given patterned structure comprising a set of physical design layout patterns for features in at least one layer of the given patterned structure;

converting the physical design layout patterns into coordinate arrays, a given coordinate array comprising feature center coordinates for the features in a given one of the physical design layout patterns;

training, utilizing the coordinate arrays, a generative adversarial network (GAN) comprising a discriminator neural network and a generator neural network; and generating one or more synthetic coordinate arrays utilizing the trained generator neural network of the GAN, a given one of the synthetic coordinate arrays comprising feature center coordinates of features for a new physical design layout pattern;

wherein converting the physical design layout patterns into coordinate arrays comprises generating the given coordinate array by populating designated entries of the given coordinate array with center coordinates for one or more features in a given field of view of the given physical design layout represented by the given physical design layout; and wherein the method is performed by at least one processing device comprising a processor coupled to a memory.

2. The method of claim 1, wherein the features comprise vias of the given patterned structure.

3. The method of claim 1, wherein the features comprise lines for the given patterned structure.

4. The method of claim 1, wherein the given coordinate array has a size of M*N, where M is a number of values for representing the center coordinates of respective ones of the features in a designated coordinate system and N is a maximum number of features in the given field of view of the given physical design layout represented by the given physical design layout pattern.

5. The method of claim 4, wherein when the given field of view comprises fewer than N features, the given coordinate array is padded with null values outside a range of possible coordinates for the given field of view of the given physical design layout pattern.

6. The method of claim 1, wherein the features comprise fixed-size rectangular features.

7. The method of claim 6, wherein the given coordinate array comprises designated entries for coordinates of respective ones of the centers of the fixed-size rectangular features.

8. The method of claim 7, wherein the coordinates of the centers of the fixed-size rectangular features comprise coordinates in a Cartesian coordinate system, wherein a first designated set of entries of the given coordinate array provide x-coordinates of the centers of the fixed-size rectangular features, and wherein a second designated set of entries of the given coordinate array provide y-coordinates of the centers of the fixed-size rectangular features.

9. The method of claim 1, wherein the given physical design layout comprises features of at least two different sizes.

10. The method of claim 9, wherein the coordinates of the centers of the features comprise coordinates in a Cartesian coordinate system, wherein a first designated set of entries of the given coordinate array provide x-coordinates of the centers of features of a first size, wherein a second designated set of entries of the given coordinate array provide y-coordinates of the centers of the features of the first size, wherein a third designated set of entries of the given coordinate array provide x-coordinates of the centers of features of a second size different than the first size, and wherein a fourth designated set of entries of the given coordinate array provide y-coordinates of the centers of the features of the second size.

11. The method of claim 1, wherein at least one of the discriminator and generator neural networks comprise a series of fully connected neural network layers.

12. The method of claim 1, further comprising applying post-processing to the generated synthetic coordinate arrays using one or more design rule checks.

13. The method of claim 1, further comprising converting the generated synthetic coordinate arrays to a format used in an electronic design automation (EDA) software.

14. The method of claim 1, further comprising utilizing the given synthetic coordinate array to evaluate manufacturability of the new physical design layout pattern.

15. A computer program product, the computer program product comprising a computer readable storage medium having program instructions embodied therewith, the program instructions executable by at least one computing device to cause the at least one computing device to perform steps of:

selecting one or more physical design layouts, a given one of the physical design layouts for a given patterned structure comprising a set of physical design layout patterns for features in at least one layer of the given patterned structure;

converting the physical design layout patterns into coordinate arrays, a given coordinate array comprising feature center coordinates for the features in a given one of the physical design layout patterns;

training, utilizing the coordinate arrays, a generative adversarial network (GAN) comprising a discriminator neural network and a generator neural network; and generating one or more synthetic coordinate arrays utilizing the trained generator neural network of the GAN, a given one of the synthetic coordinate arrays comprising feature center coordinates of features for a new physical design layout pattern;

wherein converting the physical design layout patterns into coordinate arrays comprises generating the given coordinate array by populating designated entries of the given coordinate array with center coordinates for one or more features in a given field of view of the given physical design layout represented by the given physical design layout.

16. The computer program product of claim 15, wherein the given coordinate array has a size of M*N, where M is a number of values for representing the center coordinates of respective ones of the features in a designated coordinate system and N is a maximum number of features in the given field of view of the given physical design layout represented by the given physical design layout pattern.

17. The computer program product of claim 15, wherein the program instructions further cause the at least one computing device to perform the step of utilizing the given synthetic coordinate array to evaluate manufacturability of the new physical design layout pattern.

18. An apparatus comprising:
a memory; and
at least one processor coupled to the memory and configured for:

selecting one or more physical design layouts, a given one of the physical design layouts for a given patterned structure comprising a set of physical design layout patterns for features in at least one layer of the given patterned structure;

converting the physical design layout patterns into coordinate arrays, a given coordinate array comprising feature center coordinates for the features in a given one of the physical design layout patterns;

training, utilizing the coordinate arrays, a generative adversarial network (GAN) comprising a discriminator neural network and a generator neural network; and generating one or more synthetic coordinate arrays utilizing the trained generator neural network of the GAN, a given one of the synthetic coordinate arrays comprising feature center coordinates of features for a new physical design layout pattern;

wherein converting the physical design layout patterns into coordinate arrays comprises generating the given coordinate array by populating designated entries of the given coordinate array with center coordinates for one or more features in a given field of view of the given physical design layout represented by the given physical design layout.

19. The apparatus of claim 18, wherein the given coordinate array has a size of M*N, where M is a number of values for representing the center coordinates of respective ones of the features in a designated coordinate system and N is a maximum number of features in the given field of view of the given physical design layout represented by the given physical design layout pattern.

20. The apparatus of claim 18, wherein the at least one processor is further configured for utilizing the given synthetic coordinate array to evaluate manufacturability of the new physical design layout pattern.

* * * * *